(12) United States Patent  
Frazier

(10) Patent No.: US 7,590,401 B1  
(45) Date of Patent: *Sep. 15, 2009

(54) SUPER-REGENERATIVE MICROWAVE DETECTOR

(75) Inventor: Gary Frazier, Garland, TX (US)

(73) Assignee: Raytheon Company, Waltham, MA (US)

( * ) Notice: Subject to any disclaimer, the term of this patent is extended or adjusted under 35 U.S.C. 154(b) by 604 days.

This patent is subject to a terminal disclaimer.

(21) Appl. No.: 11/283,243

(22) Filed: Nov. 17, 2005

Related U.S. Application Data

(62) Division of application No. 09/716,417, filed on Nov. 21, 2000, now Pat. No. 6,993,315.

(51) Int. Cl.  
*H04B 1/16* (2006.01)  
*H03B 7/08* (2006.01)

(52) U.S. Cl. ............. 455/334; 455/336; 455/226.2; 455/215; 331/107 T; 331/132; 331/174

(58) Field of Classification Search ............ 455/334, 455/336, 337; 331/107 R, 107 T  
See application file for complete search history.

(56) References Cited

U.S. PATENT DOCUMENTS

| | | | | |
|---|---|---|---|---|
| 3,621,465 A * | 11/1971 | Beaty | .............. | 331/107 T |
| 3,883,809 A * | 5/1975 | Ver Planck et al. | .......... | 455/336 |
| 4,044,303 A | 8/1977 | Reindel | .............. | 324/95 |
| 4,143,324 A | 3/1979 | Davis | .............. | 455/336 |
| 4,398,283 A * | 8/1983 | Pottier | .............. | 370/281 |
| 4,573,212 A * | 2/1986 | Lipsky | .............. | 455/282 |
| 4,749,964 A | 6/1988 | Ash | .............. | 331/107 A |
| 4,831,340 A * | 5/1989 | Sollner | .............. | 331/76 |
| 4,985,621 A * | 1/1991 | Aull et al. | .............. | 250/214 LS |
| 5,068,663 A | 11/1991 | Valentine et al. | .............. | 342/20 |
| 5,146,613 A | 9/1992 | Anderson | .............. | 455/78 |
| 5,311,020 A | 5/1994 | Silver et al. | .............. | 250/338.4 |
| 5,461,645 A * | 10/1995 | Ishii | .............. | 375/344 |
| 5,539,761 A * | 7/1996 | Golub et al. | .............. | 372/38.02 |
| 5,572,450 A * | 11/1996 | Worthy | .............. | 702/85 |
| 5,621,756 A * | 4/1997 | Bush et al. | .............. | 375/219 |
| 5,630,216 A | 5/1997 | McEwan | .............. | 455/215 |
| 5,751,197 A * | 5/1998 | Boling, III | .............. | 331/107 A |
| 5,946,609 A | 8/1999 | Morey | .............. | 455/336 |
| 6,118,828 A | 9/2000 | Schleifer | .............. | 375/317 |
| 6,175,325 B1 | 1/2001 | Ono | .............. | 342/20 |
| 6,668,165 B1 | 12/2003 | Cloutier | .............. | 455/336 |
| 6,904,101 B1 * | 6/2005 | Tang | .............. | 375/316 |
| 6,993,315 B1 * | 1/2006 | Frazier | .............. | 455/334 |

* cited by examiner

*Primary Examiner*—Duc M Nguyen  
(74) *Attorney, Agent, or Firm*—Baker Botts L.L.P.

(57) ABSTRACT

A resonant tunneling diode or diode array oscillator (10) including a resonant diode (11) is coupled to a millimeter-wave source (14) and a quench generator (16) for periodically quenching the oscillations so that the average oscillation time of the oscillator is proportional to signal strength of the source (14). The signal source can be from an antenna such as a dipole or tapered slot line antenna.

9 Claims, 19 Drawing Sheets

SUPER-REGENERATIVE MICROWAVE DETECTOR

RELATED APPLICATIONS

This application is a divisional of U.S. application Ser. No. 09/716,417, filed Nov. 21, 2000, entitled "Super-Regenerative Microwave Detector," now U.S. Pat. No. 6,993,315.

TECHNICAL FIELD OF THE INVENTION

This invention relates to microwave detectors and more particularly to a very sensitive detector of millimeter wavelength (millimeter-wave) RF signals and sub-millimeter wavelength (sub-millimeter-wave) RF signals.

BACKGROUND OF THE INVENTION

Microwave detectors are essential microwave components. They convert RF energy into electrical form for analysis. The subject detector can be used anywhere high sensitivity is required in a simple detector. Obvious applications include simple sub-millimeter-wave imagers, phased array receivers, proximity detecting warhead fuses, and communication links. Since the detector is an oscillator, it can be configured as a transmitter and a receiver in the same circuit. This permits its use in simple wideband communication links and proximity detectors.

Homodyne detectors detect RF energy at the carrier frequency, and output the information carried on the RF signal as a demodulation waveform. To minimize power consumption in wideband front-end amplifiers, these detectors should be very sensitive.

Typically, Schottky diodes are used as square-law detectors at millimeter (mm) wavelength (>50 gigahertz or >50 GHz) frequencies. Often, the millimeter-wave signal is down-converted to a lower frequency for easier amplification and detection at a so-called intermediate frequency. Schottky detectors can operate directly at deep millimeter-wavelengths (>500 GHz), but they are very lossy and have noise figures on the order of 12 dB at 500 GHz. To override the negative effect of this high loss, a low-noise >1000 Hz preamplifier must be placed ahead of the detector. However, this amplifier component not easily provided by transistor technology due to the extreme frequencies involved. So, previous detectors have either high loss or require complicated RF circuitry to efficiently detect millimeter-wave signals.

SUMMARY OF THE INVENTION

In accordance with one embodiment of the present invention this invention solves the problem of providing very sensitive direct detection of millimeter-wave and sub-millimeter-wave RF signals. This invention creates an oscillator using resonant tunneling diodes (RTDs) at the center frequency of the signals of interest. The oscillator is periodically shut down (quenched) and restarted such that the duty cycle of the oscillator varies with the strength of the input signal coupled to the oscillator. The oscillator startup time is directly and linearly related to the strength of the input signal. The oscillating detector, called a super-regenerative detector, is also highly sensitive, and can directly detect RF signals at or below the thermal noise floor of the system. The rate at which the oscillator is quenched directly controls the bandwidth and sensitivity of the circuit. The circuit is capable of operating to the oscillation limit (fmax) of RTDs, or about 2000 GHz.

DETAILED DESCRIPTION OF THE INVENTION

Figure 1:
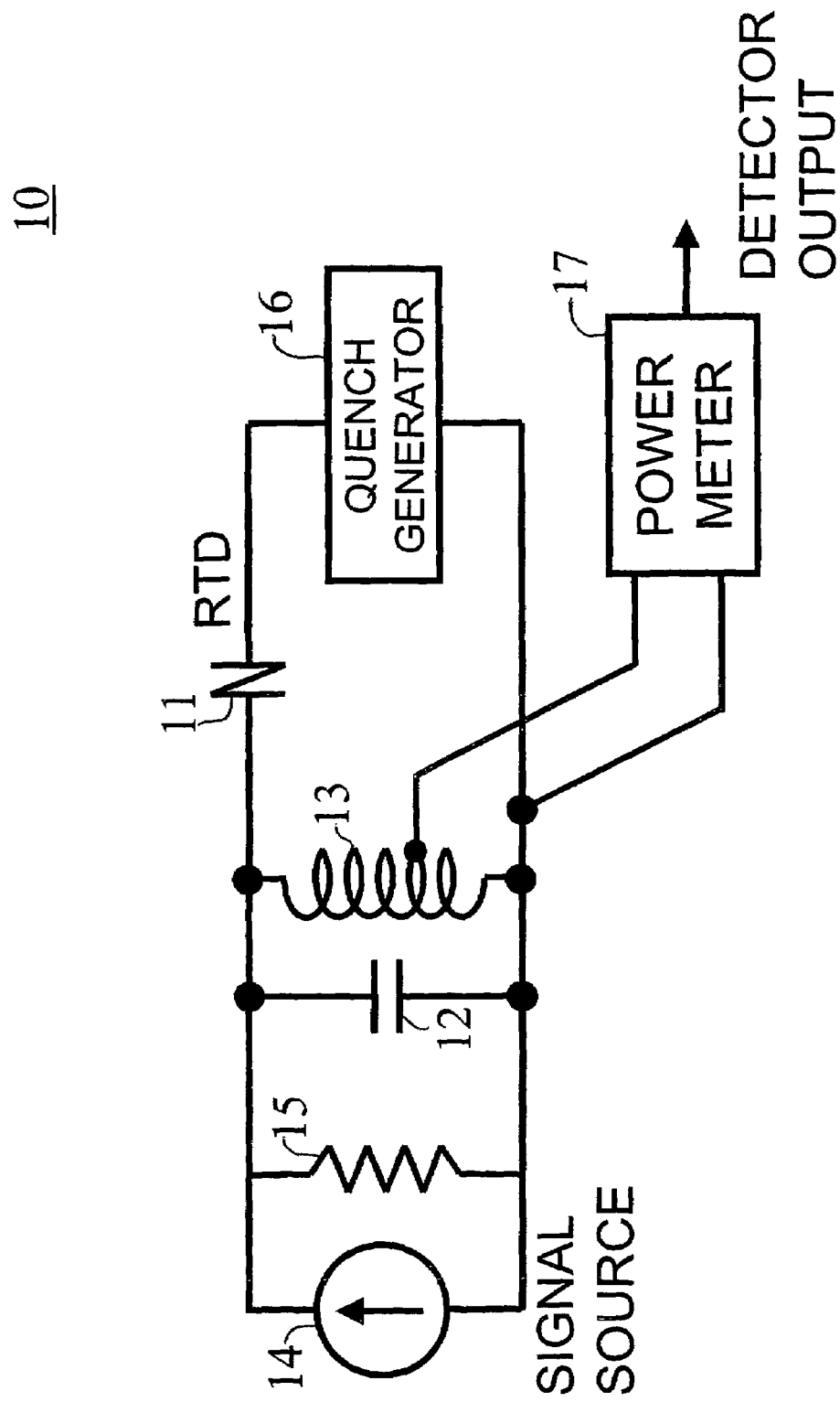
FIG. 1 shows a schematic of a conceptual super-regenerative millimeter-wave detector.

When power is applied to any electronic oscillator, steady state oscillations build up from random noise fluctuations within the circuit. The turn-on delay, the time between power-up and stable oscillation, is controlled by the overall gain, feedback, and noise level within the circuit. This characteristic turn-on time can be shortened by injecting a coherent, resonant signal into the oscillator. The circuit gain amplifies the injected signal, feeding back the amplified wave until stable oscillation is achieved. The final amplitude of the oscillations may be a million times greater than the strength of the injected input signal. This effect, called super-regeneration, can be used to build simple, highly sensitive radio frequency detectors using resonant tunneling devices. Due to their high intrinsic speed, super-regenerative detectors based on resonant tunneling devices can operate well above 1000 GHz. FIG. 1 shows a schematic of a conceptual super-regenerative millimeter-wave (30-300 GHz) detector 10. A resonant tunneling diode (RTD) 11 is coupled to a tuned circuit composed of capacitor 12 and inductor 13 forming an oscillator with characteristic frequency F. The oscillator is coupled to a signal source represented by current source 14 and source resistance 15, and the circuit is energized by a quench waveform generator 16. The output of the detector is taken from power meter 17 which measures the average oscillator power.

The waveform generator 16 applies periodic power to the RTD such that the circuit undergoes repeated build-up and decay of self-oscillations even in the absence of external signal 14. We refer to the on-off modulator as the "quench generator" and the on-off rate as the "quench" frequency. When an external signal of frequency F is applied to the circuit the buildup of oscillation occurs earlier in the quench cycle so that the duty factor of oscillation changes in proportion to the strength of the input. A measurement of the average energy of circuit oscillations provides a direct measure of the relative strength of the input signal. Since the average oscillation power is related to the signal strength, the changes in the measured power over time correspond to changes in the amplitude of the signal "carrier." Information impressed on the signal carrier by amplitude modulation can thus be recovered or detected by circuit 10. According to well-known information theory, the instantaneous bandwidth of information that can be unambiguously detected by the circuit is about one half of the quench frequency. The periodic waveform generator 16 is also an oscillator operating at a relatively low frequency, preferably less than 10% of the RF carrier frequency. For example, a circuit designed to detect 300 GHz signals might have a quench circuit oscillate at 10 GHz if it desired to detect modulated signals with a bandwidth of up to 5 GHz.

As is very well known in the art, a resonant tunneling diode, also known as the quantum well diode, utilizes the tunneling of electrons through a pair of potential energy barriers to produce negative differential conductance effects. A RTD typically consists of a multi-layer stack (heterostructure) of epitaxially grown semiconductor material so formed to produce a single quantum energy well surrounded by twin energy barriers. Electrons incident upon this structure will be reflected from the structure except for certain well defined energies. These energies correspond to resonant energy levels within the quantum well, and conductance through the structure for these energies is very efficient. A typical design for an RTD is given in Table 1. These layers are grown using molecular beam epitaxy or chemical vapor deposition methods using compounds of Indium (In), Arsenic (As), Gallium (Ga), Aluminum (Al), and Phosphorous (P). RTDs based on InGaAs quantum wells and AlAs tunnel barriers are easily grown on standard InP substrates. Various dopants such as silicon and boron can be used to alter the conductivity of each layer. Such diodes can also be fabricated using AlGaAs compounds on GaAs substrates.

TABLE 1

Typical Resonant Tunneling Diode Heterostructure.

| Layer Name | Material | Doping Density | Thickness in Angstroms or Monolayers |
| --- | --- | --- | --- |
| Top Contact | InGaAs | 2E19/cc | 500 Angstroms |
| Spacer | InGaAs | undoped | 50 Angstroms |
| Aluminum | AlAs | undoped | 6.5 monolayers |
| Quantum Well | InGaAs | undoped | 10 Angstroms |
| Quantum Well | InAs | undoped | 20 Angstroms |
| Quantum Well | InGaAs | undoped | 10 Angstroms |
| Aluminum | AlAs | undoped | 6.5 monolayers |
| Spacer | InGaAs | undoped | 50 Angstroms |
| Top Contact | InGaAs | 2E19/cc | 2000 Angstroms |
| Substrate | InP | undoped | 0.018 inches |

Figure 2:
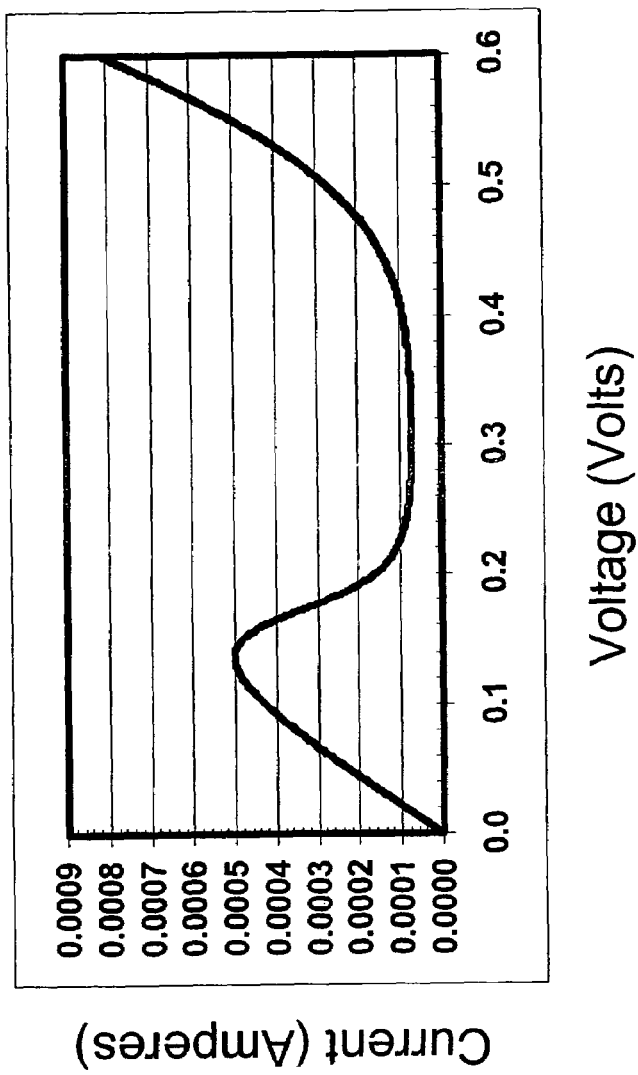
FIG. 2 shows the current versus voltage response of a typical resonant tunneling.
Figure 3:
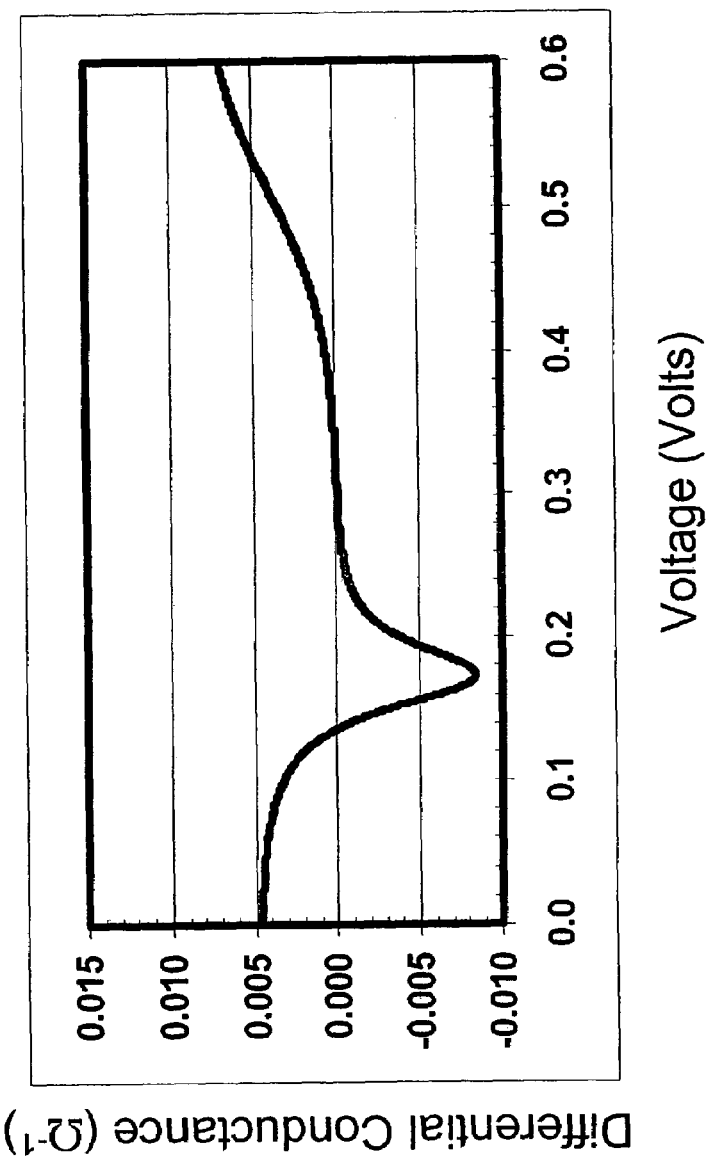
FIG. 3 shows the differential conductance of the resonant tunneling diode of FIG. 2.

Under electrical bias between the top contact and the bottom contact, the electrical current in the diode will first rise with increasing bias, then precipitously drop with further bias, then rise again with even further bias as shown in FIG. 2. FIG. 2 shows the current versus voltage response of an RID of Table 1 that exhibits 50,000 amperes/cm2 of current at the first resonance. The response is for a device of 1 square micrometer of cross-sectional area. The initial rise and peak in the diode current, at about 0.14 volts of bias, is due to quantum mechanical tunneling of electrons through the lowest energy conduction band resonance established within the heterostructure. The second rise in current after 0.3 volts of bias is due to the onset of tunneling through the next higher energy resonance. The falloff in current, at bias voltages between 0.14 and 0.3 volts in the figure, has a negative slope. The negative differential conductance (or conversely the negative differential resistance) associated with this bias regime for this device is shown in FIG. 3. Within this bias range the RTD can be used as a gain element for amplification or oscillation. The maximum negative differential conductance occurs at about 0.17 volts in this exemplary device, which is also the bias point of maximum available gain. Connecting the RTD to a resonant electrical circuit can produce amplification and selfstarting oscillation if the magnitude of this gain exceeds the losses within the circuit. This ability to support amplification and oscillation within an electronic circuit is characteristic of any electrical device that exhibits negative differential conductance. REF: "Basic Theory And Application of Tunnel Diodes," S. P. Gentile, Van Nostrand, Princeton N.J. (1962) At the present state of the art, the resonant tunneling diode is the fastest semiconductor with intrinsic electronic gain. RTDs have been shown to oscillate above 700 GHz. (REF:Brown et. al. "High Frequency Resonant tunneling Oscillators," Microwave and Optical Technology Letters, Vol. 4, No. 1, January 1991, pp 19-23) Therefore, the fastest oscillators based on semiconductor gain elements must currently employ resonant tunneling diodes. A millimeter-wave and sub-millimeter wavelength detectors based on the super-regeneration principle should employ resonant tunneling diodes.

Figure 4:
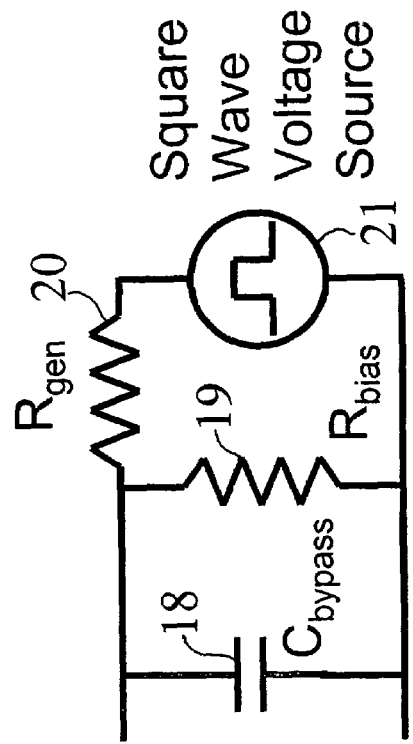
FIG. 4 shows a schematic of a conceptual quench generator as used to excite a superregenerative millimeter-wave detector.
Figure 4:
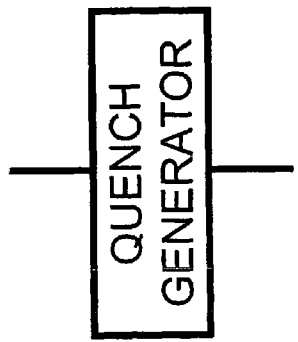

Based on the need for circuit in detector 10 to controllably oscillate using a RTD, the electrical properties of quench generator 16 in detector 10 must meet several requirements. First, it must present a very low impedance at the signal frequency so that the size of, or changes in, the generator do not affect the resonant frequency of the detector. Since the generator preferably operates at a frequency much lower than F and must supply operating power to the detector, it may typically be composed of relatively large, low frequency components. The size of these components and their interconnection wiring may be of the order of a wavelength at F, which could cause undesired parasitic resonance and oscillations in the detector 10. In practice, the requirement of a low impedance can be met by placing a capacitor across the output terminals of the generator 16. This signal bypass capacitor 18 is shown in FIG. 4. The second requirement of the generator is that it present a sufficiently low dc resistance to the detector circuit. In order for the circuit 10 to oscillate controllably and in a sinusoidal fashion, the dc resistance presented by the circuit to RTD 11 must be less than the magnitude of the peak negative differential resistance of the RTD. In equation form, proper operation of detector 10 as a quenched superregenerative detector requires that $$-RRTD(dc) > RCircuit(dc) \quad \text{Equation 1}$$

where RRTD(dc) is the differential dc resistance of the RTD and RCircuit(dc) is the equivalent differential dc conductance of the circuit connected to the RTD. As an example, the peak negative differential resistance of the diode of FIG. 3 is $(-1/8.4E-3) = -119$ ohms. For this RTD to be correctly used in detector 10, the total effective dc resistance across the RTD must be less than 119 ohms. To provide design margin, RCircuit is preferably limited to a value no greater than ½ of (−RRTD).

Since the quench generator 16 is placed in series with the RTD in detector 10, it follows that the dc resistance of the quench generator must be less than the magnitude of the peak negative differential resistance of the RTD, and less than ½ of this value for design margin. If the rest of the circuit also has non-zero dc resistance, the dc resistance of the generator must be reduced further by a similar amount.

The required low dc resistance of generator 16 can be ensured by using a shunt bias resistor 19 placed across the output terminals of the generator. The value of resistor 19 is adjusted down in value until the parallel combination of resistor 19 and the output resistance 20 of voltage source 21 meets the oscillation condition set by Equation 1. For some embodiments of the generator voltage source 21, its output resistance 20 may be sufficiently low to avoid the need for resistor 19.

The combination of voltage source 21 and series resistor 20 represents an idealized waveform generator, but closely approximates standard laboratory signal generators. Typically, the output resistance of radio frequency generators is 50 ohms. However, RF transformers may be used to step-up or step-down the impedance and resistance of the generator output to whatever value is required by detector 10. Generators with sine-like, rectangular-like, triangle-like, and sawtooth-like waveforms can be used as the quench generator.

Figure 5:
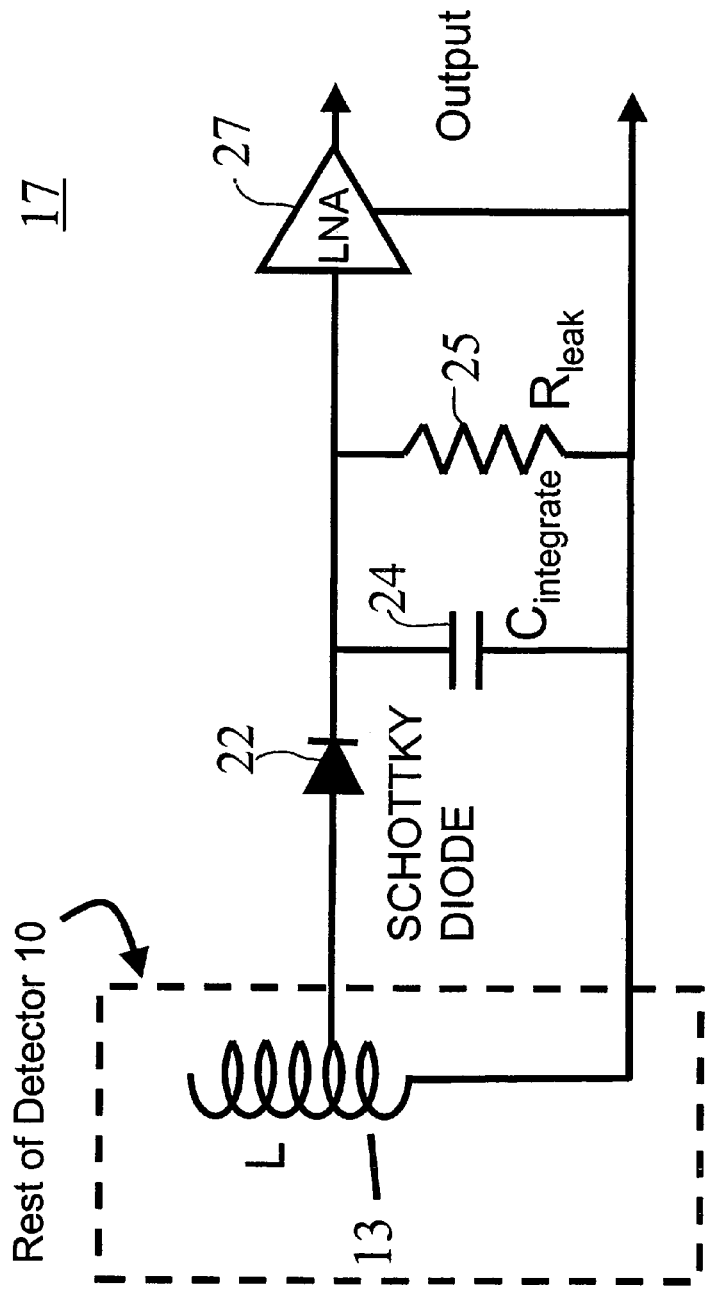
FIG. 5 shows a schematic of a conceptual power meter as used in a millimeter-wavelength detector.

The power meter 17 in detector 10 must provide an output signal that is proportional to the average RF power contained in the detector circuit at the signal frequency F. This can be accomplished as shown in FIG. 5 using a Schottky diode envelope detector. A Schottky diode 22, with sufficient switching speed to rectify signals at frequency F is connected to inductor 13 and an RC filter network comprised of capacitor 24 and resistor 25. A low noise amplifier 27 is connected to the RC network to buffer the power meter circuit from subsequent instrumentation. Power meter 17 operates as follows. RF energy at frequency F is periodically stored and released from inductor 13. Some of the RF voltage across inductor 13 is applied across diode 22 and the parallel combination of capacitor 24 and resistor 25. When forward biased by the RF voltage, diode 22 acts as a resistor of low value and the capacitor becomes partially charged. When reversed biased by the changing polarity of the RF voltage, diode 22 acts as an open circuit so that capacitor 24 does not significantly discharge back through diode 22 during this half cycle. Thus on each RF cycle, the capacitor tends to accumulate a net charge proportional to the strength of the received RF energy. Resistor 25 provides a leakage path for charge stored on the capacitor so that the long-term average voltage across the capacitor rises and falls with the long-term average of the RF voltage across inductor 13.

Preferably diode 22 should be connected to a point on inductor 13 that provides the minimum loading of the oscillator while providing sufficient RF voltage to be detected. Alternatively, diode 22 can be magnetically coupled to inductor 13 by connecting a grounded inductor between diode 22 and ground, and then placing this inductor in the proximity of inductor 13.

Preferably the RC time constant of the parallel combination of capacitor 24 and resistor 25 should be roughly equal to the quench period (1/quench rate) of quench generator 16 but significantly longer than the signal period (1/F). For example, if power meter 17 is used to measure 100 GHz oscillation from an oscillator quenched at a 1.67 GHz rate, capacitor 24 might have a value of 20 picofarads and resistor 25 should then have a value of about 50 ohms. The low-noise amplifier 27 is connected across the RC network to serve as a buffer of the measured power. The output of this amplifier represents the overall output of detector 10. If the input resistance of amplifier 27 is very low then resistor 25 should be adjusted so that the overall RC time constant for the power meter 17 is roughly equal to the period of the quench rate for detector 10.

Figure 6:
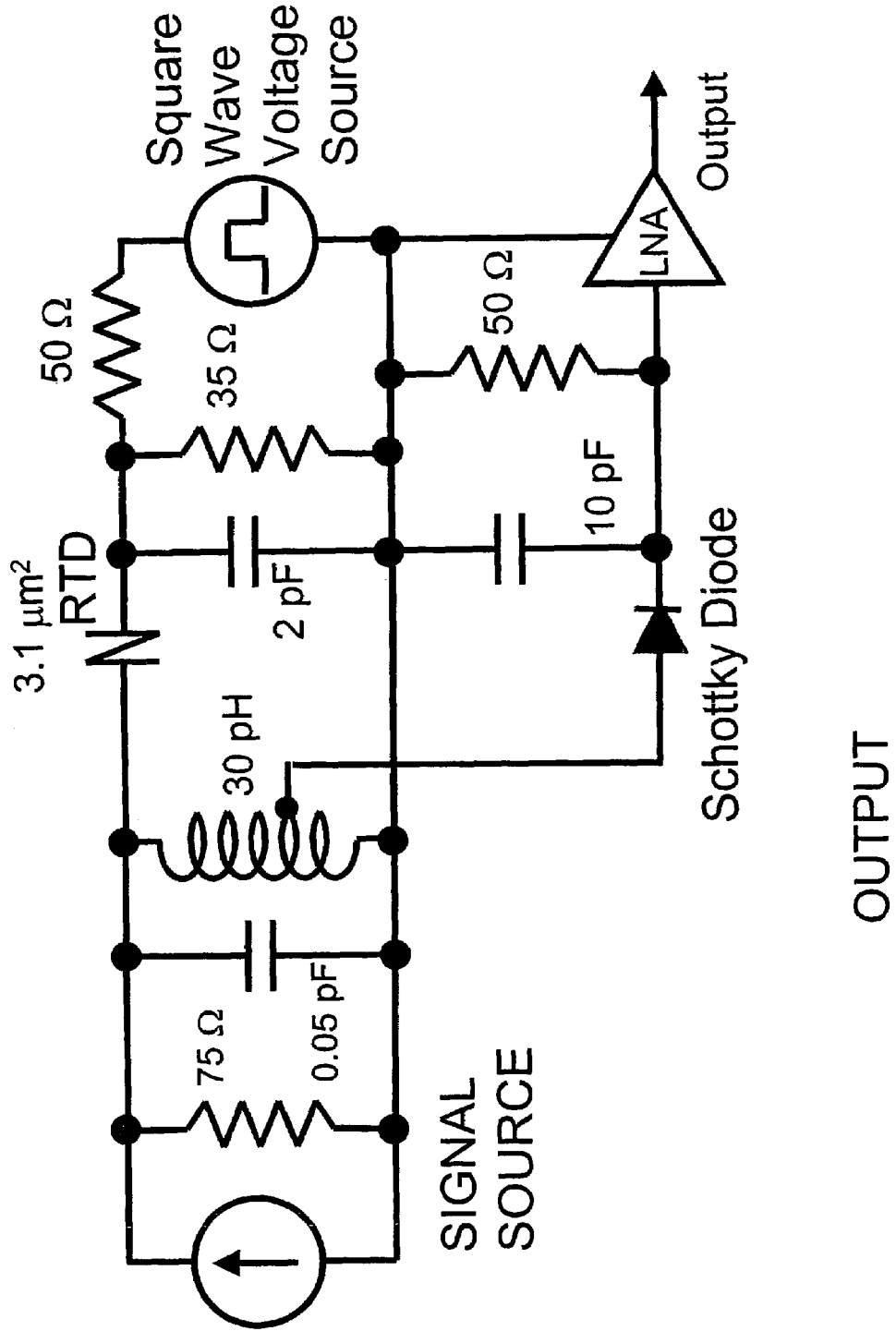
FIG. 6 shows a schematic of a super-regenerative millimeter-wave detector with component values.

FIG. 6 shows a complete circuit for a super-regenerative detector 10 based on a quenched RTD oscillator and a Schottky diode power meter. The quench generator subcircuit consists of a 2 pF capacitor, a 35 ohm bias resistor, and an ideal rectangular waveform generator with a 50 ohm source resistance. The equivalent dc resistance of the quench circuit is about 20 ohms. The generator has a peak open circuit output voltage of 0.9 volts and a minimum open circuit output voltage of 0.46 volts. The quench generator has a fixed repetition rate of 1.67 GHz (1 GHz=1E9 Hertz). The RTD has a peak current density of 50,000 amperes/cm2 and an active area of 3.1 square micrometers. The input signal source consists of an ideal gated RF current source and a 75 ohm shunt resistor. The signal source has an on-off duty factor of 50% and a pulse repetition rate of 833 MHz (1 MHz=1E6 Hertz). The detector has a center oscillation frequency of 116 GHz. The signal source is ideally set equal to the center oscillation frequency. The power meter consists of an ideal power meter. The power meter subcircuit consists of a Schottky diode, 20 pF capacitor, a 50 ohm resistor, and a low noise amplifier.

Figure 7:
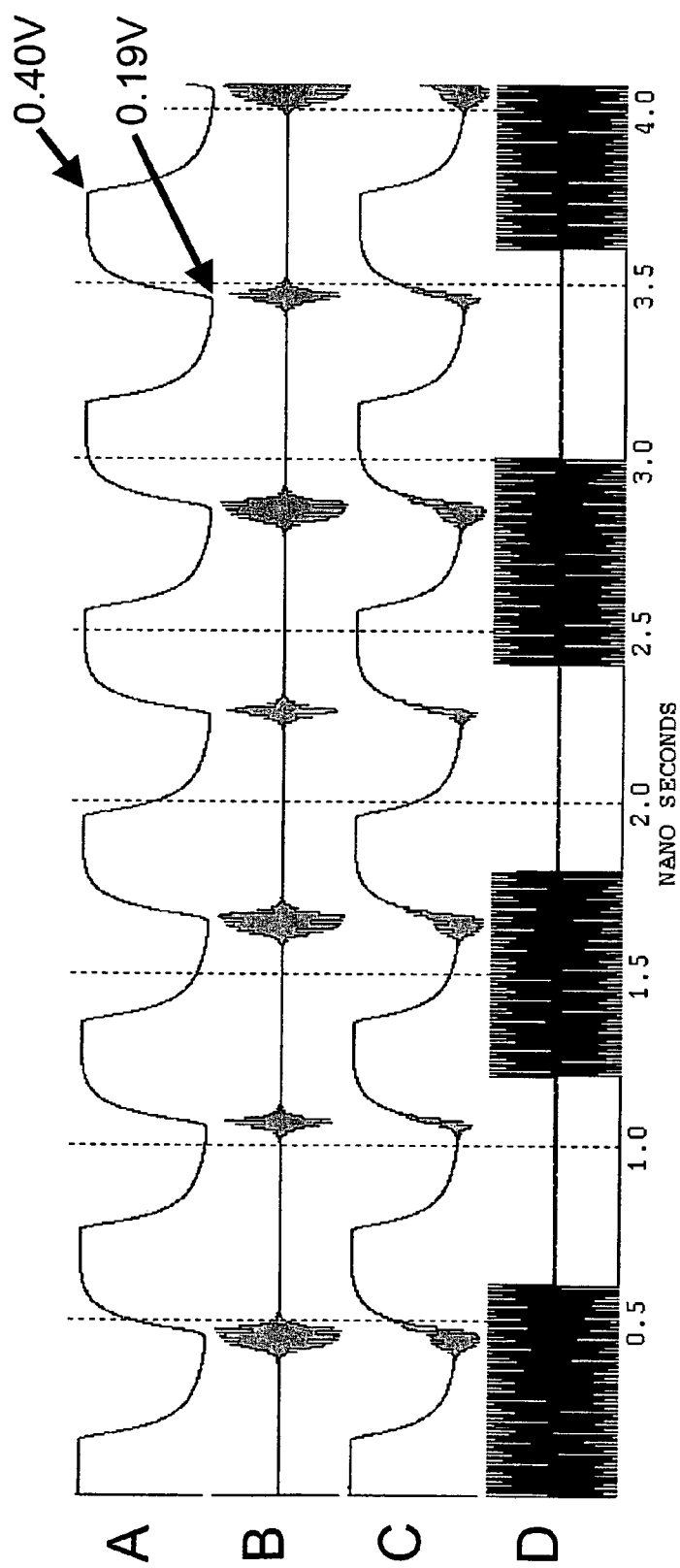
FIG. 7 illustrates a SPICE simulation of the response of the millimeter wavelength circuit represented in FIG. 6.
Figure 8:
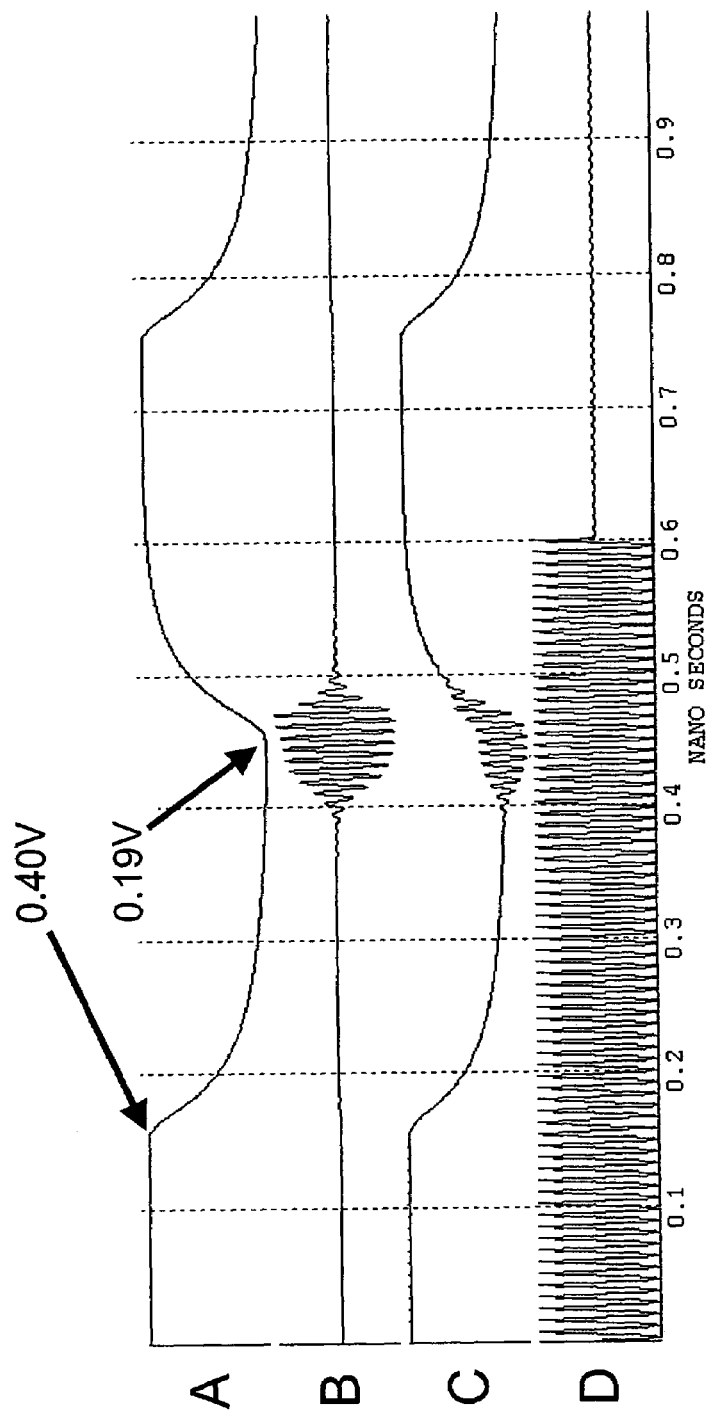
FIG. 8 illustrates an expanded view of FIG. 7 during a time where the detector is sensing an external signal.

FIG. 7 shows a 1.8 nanosecond long simulation of the operation of detector 10 in the embodiment of FIG. 6. Trace-A records the voltage across the 2 pF capacitor. Trace-B records the voltage across the 30 pH inductor. Trace-C records the voltage across the RTD. Trace-D records the current provided by the RF signal source. Operation of the detector proceeds as follows. Initially the quench waveform has a high (0.9 Volt) value. This results in a potential difference of 0.4 volts across the 2 pF capacitor and the RTD. With reference to FIG. 3, the RTD is thus biased in a region of slightly positive differential resistance. When the generator voltage changes to its minimum value, the dc voltage across the 2 pF capacitor and the RTD drops to about 0.19 volts with a time constant of about 20 ohms*2 pF=40 picoseconds. At a relative point in time near 0.45 nanoseconds, the RTD becomes biased within its region of negative differential conductance and the circuit builds up oscillations at its resonant frequency. The onset of oscillation in the circuit at 0.45 nanoseconds occurs while the input signal is applied to the circuit. Soon after oscillation begins, the quench waveform voltage across the RTD rises toward its maximum value of 0.4V. This rise biases the RTD out of negative differential conductance and into positive differential conductance. At this bias the RTD acts as a passive positive resistance and dissipates the RF energy stored within the circuit. On the next cycle of the quench waveform the circuit breaks into oscillation at a relative time of about 1.1 nanoseconds into the simulation. In this cycle the input signal is turned off, and the oscillator starts naturally due to random electrical fluctuations in the circuit. It will be seen that the duration and strength of the spontaneous (input off) oscillation of the circuit is less than the driven (input on) oscillation condition. The correlation of the strength of the RF oscillation with the presence or absence of the input is clearly evident. FIG. 8 provides a time-expanded view of the circuit of FIG. 6 when operating in the driven mode.

Figure 9:
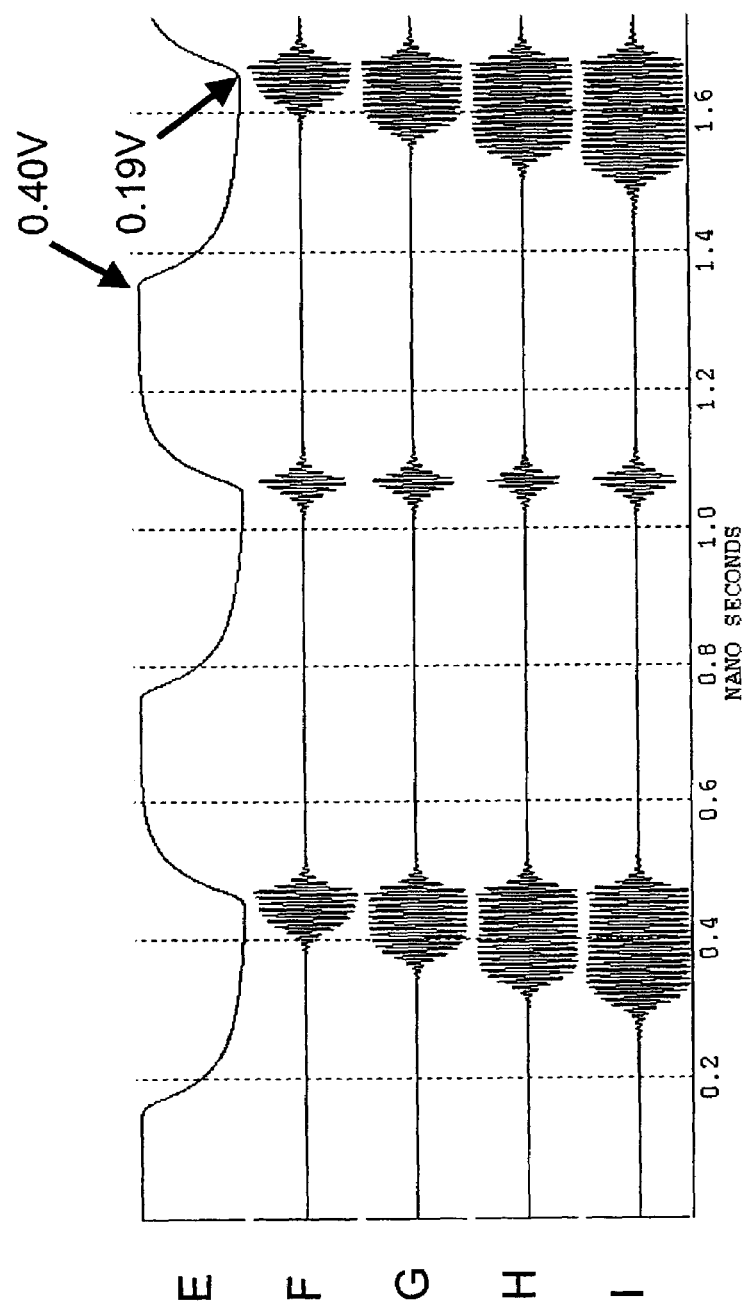
FIG. 9 illustrates a SPICE simulation of the response of the millimeter wavelength circuit represented in FIG. 6 for differing levels of input signal strength.
Figure 10:
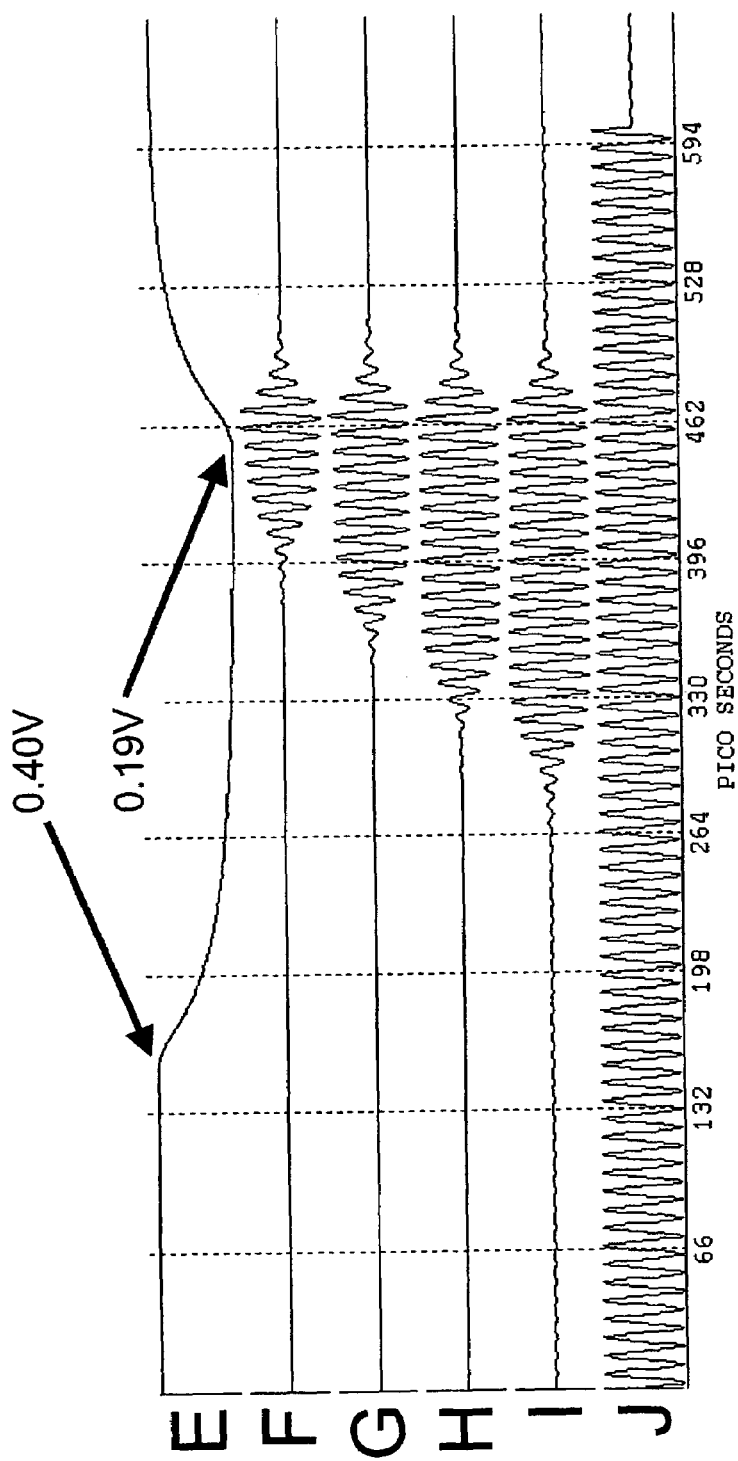
FIG. 10 is an expanded view of FIG. 9 during a time where the detector is sensing an external signal.

FIG. 9 plots the time domain response of the circuit in FIG. 6 to various levels if input signal power. Trace E records the voltage across the 2 pF capacitor. Trace F records the response of the circuit to an average input signal power of 0.002 picowatts. Trace G records the response of the circuit to an average input signal power of 0.2 picowatts. Trace H records the response of the circuit to an average input signal power of 20 picowatts. Trace I records the response of the circuit to an average input signal power of 2000 picowatts. During the time when the input source is on, it is seen that the duration and total RF power of the oscillation is related to the logarithm of the strength of the input signal. The oscillation duration and strength of the oscillation during the undriven timeframe (around 1 nanosecond into the simulation) is independent of input signal strength. Therefore, the measurement of the RF voltage or power in the circuit provides a direct measure of the presence and strength of the input signal. FIG. 10 shows an expanded view of FIG. 9 for one quench cycle. Trace J in FIG. 10 shows the input signal source current.

Figure 11:
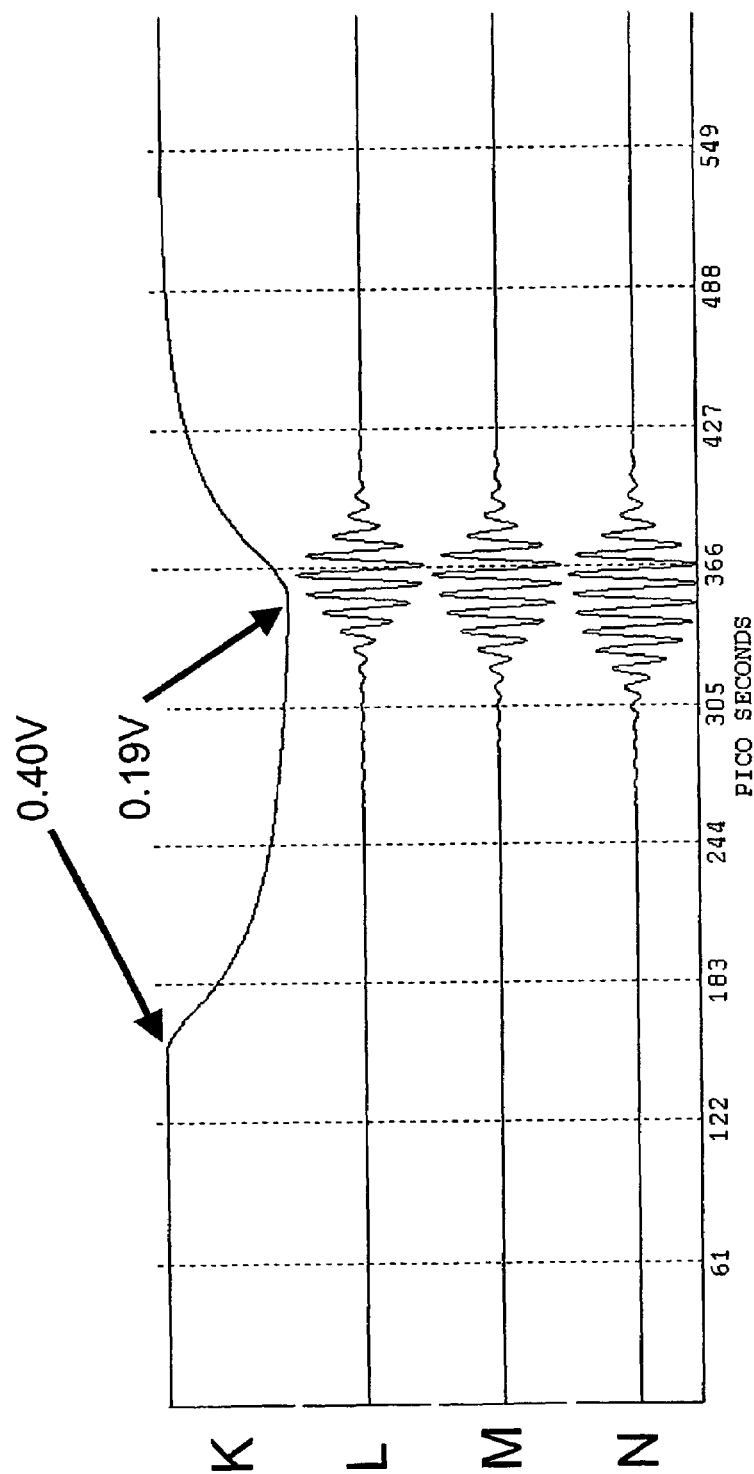
FIG. 11 illustrates a SPICE simulation of the response of the millimeter wavelength circuit represented in FIG. 6 when adjusted to provide a linear response to changes in input signal strength.

The precise functional relationship between the input signal power and the average RF power of the oscillating detector is controlled by the shape, rate and amplitude of the quench waveform. The operation of the circuit in FIG. 6 using the simulation conditions of FIG. 10 produces a roughly logarithmic increase in average oscillation power with the increase in the power of the input signal. A linear response of detector 10 can be obtained by adjusting the quench waveform so that the RF oscillations are not allowed to reach a steady state condition. FIG. 11 shows a simulation of the same circuit as in FIG. 6, but where the duty factor of the rectangular quench waveform is reduced to roughly 180 ps/1200 ps=15%. For this quench waveform, the time during which the RTD is biased at maximum negative differential conductance is so shortened that the oscillation waveform never reaches a steady state value. In this mode of operation, the oscillation power increases roughly linearly with the strength of the input signal. Trace K records the voltage across the 2 pF capacitor in FIG. 6. Trace L records the response of the circuit to an average input signal power of 10 picowatts. Trace M records the response of the circuit to an average input signal power of 40 picowatts. Trace N records the response of the circuit to an average input signal power of 160 picowatts. A linear response of the detector may be required when it is used to detect amplitude modulated analog signals while a logarithmic response may be useful when detecting pulsed RF signals modulated by on-off digital information.

Figure 12:
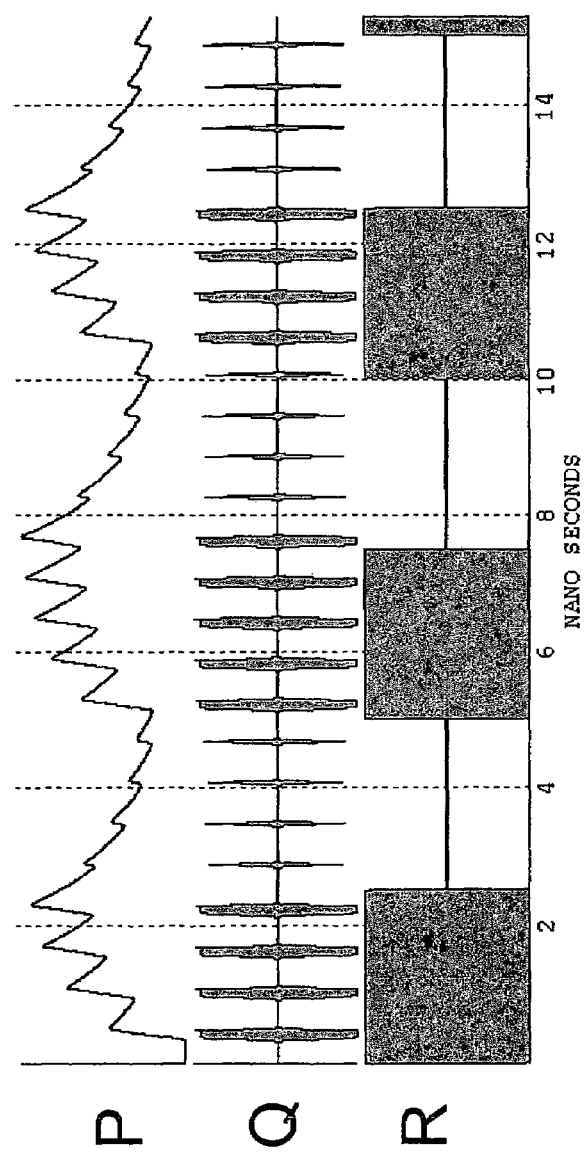
FIG. 12 illustrates a SPICE simulation of the circuit of FIG. 6 showing the output of a millimeter wavelength power meter used to monitor super-regenerative oscillations.

The output of the power meter in the circuit of FIG. 6 is shown in FIG. 12 for the case of a gated 116 GHz input signal. The signal source is alternately turned on and off every 2.5 nanoseconds. The quench rate is 1.67 GHz. Trace-P shows the voltage across the 20 pF capacitor over time. Trace-Q shows the voltage across the inductor 13 and Trace-R shows the input signal current. The voltage across the 20 pF capacitor has the same general envelop as the modulated input signal. This shows that the detector faithfully recovers the modulation impressed on the input RF signal.

The sensitivity and bandwidth of detector 10 can be controlled by adjusting the quench frequency. A low quench frequency allows very weak signals enough time to stimulate a slow buildup of steady state oscillations in the detector, but necessarily reduces the allowable signal modulation rate. A high quench rate increases the instantaneous detection bandwidth but requires stronger inputs so that oscillation buildup can occur in a shorter time. For weak-signal detection, a very low quench rate can be used to permit detector to recover signals that have an RF power below that of ambient thermal and electrical noise. The quench frequency might be set to several hundred GHz when used to detect large-signal, wide bandwidth sub-millimeter waves. Thus, detector 10 provides a simple means to trade detector bandwidth for sensitivity. This flexibility could be very useful in dynamic noise environments where wideband information can be transferred while the level of ambient and thermal noise is high, while a narrow-band mode can be used to detect signals near the noise floor.

Figure 13:
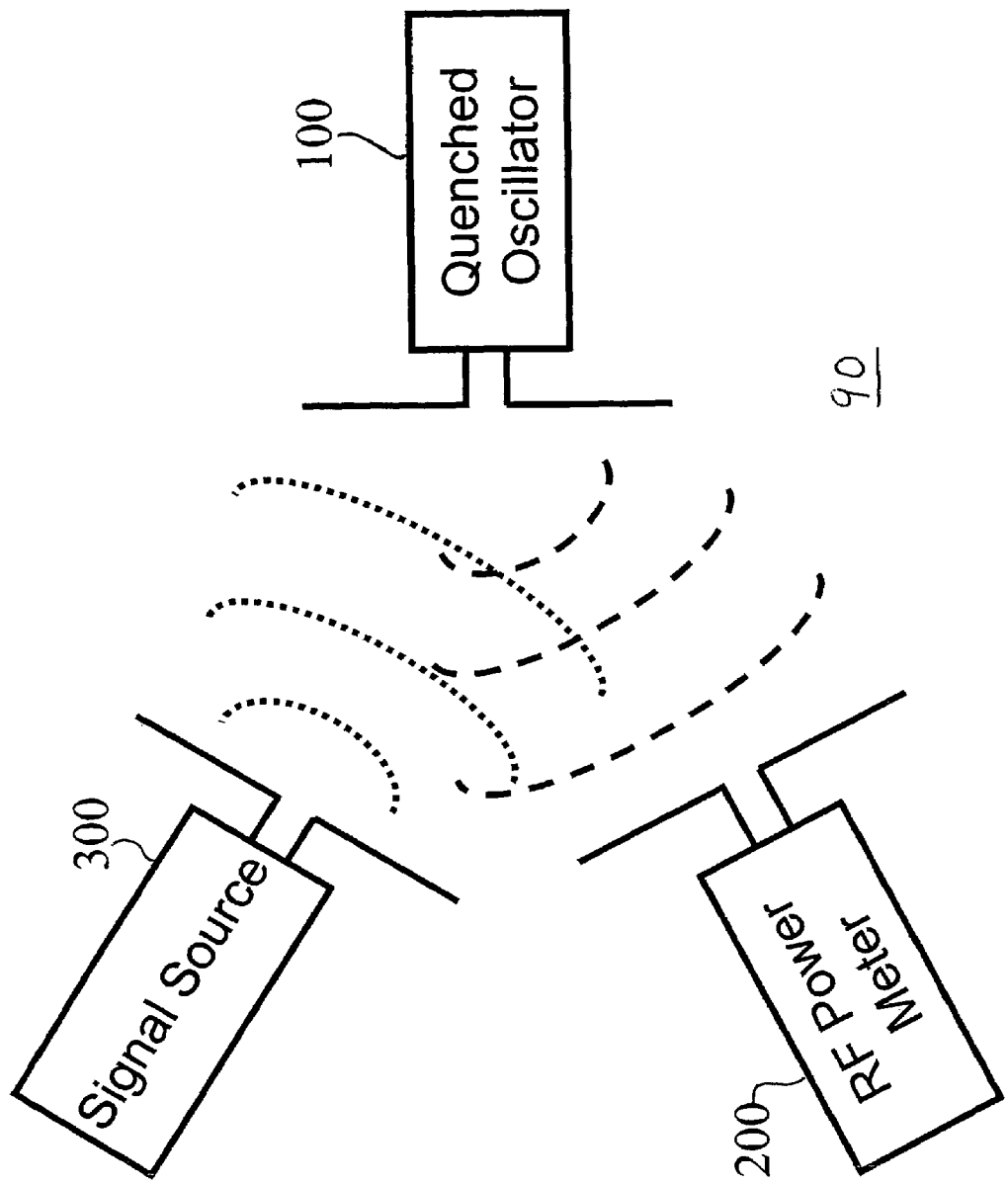
FIG. 13 illustrates a super-regenerative detector of free-space millimeter-wavelength signals.
Figure 14:
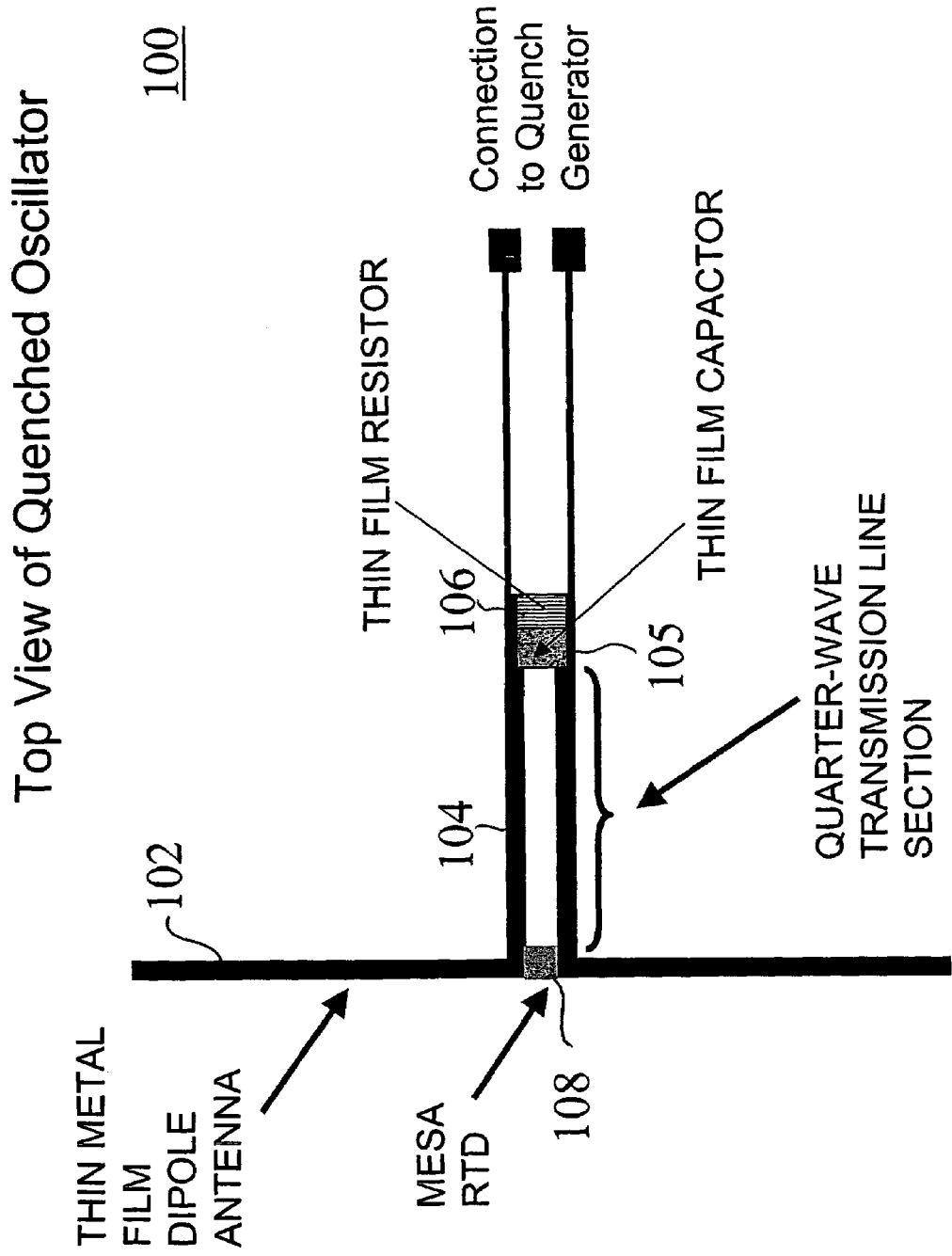
FIG. 14 shows the top view of a monolithic quenched oscillator for the detection of free-space millimeter wavelength signals.

The detector 10 can be embodied in many different ways. A preferred physical embodiment 90 for detector 10 when used to directly detect free space RF signals is shown in FIG. 13. The detector consists of a quenched oscillator 100 and an adjacent RF power meter 200. The system is used to detect signals from signal source 300 that propagate in free space. In quenched oscillator 100, the input signal source is replaced by a dipole antenna 102 that is resonant at the desired RF signal frequency F. This embodiment is shown in FIG. 14. A RTD 108 is placed across the dipole terminals. At resonance, the dipole antenna presents to RTD 108 the equivalent electrical effect as a pure resistance in parallel with an RF current source. Received RF current passes through the RTD to alter its oscillation duty factor. The detector output is taken from power meter 200 which measures the average RF oscillation power radiated from quenched oscillator 100. The quench waveform is applied to RTD 108 via a section of RF transmission line 104. A thin film capacitor 105 and resistor 106 are connected in parallel and placed across the transmission line 104. Capacitor 105 is adjusted to have a low (few ohms) of reactive impedance at the signal frequency F. Resistor 106 provides the low dc resistance required to meet the oscillation condition set by Equation 1. The electrical length of transmission line 104 between RTD 108 and capacitor 106 is adjusted to be one quarter wavelength at the signal frequency. It is well known that a line of this length (or any odd integer multiple thereof) will present an impedance to the RTD equal to (Zline)2/Zquench, where Zline is the characteristic impedance of the transmission line at the signal frequency and Zquench is the impedance of the quench generator 16 at the signal frequency. Zquench is equal to the impedance of the parallel combination of capacitor 105, resistor 106, and the quench generator. If the quench impedance is very much less than the line impedance then the impedance of the quench generator as seen by the RTD becomes very high. As a result of the use of line 104 the quench generator does not place a significant load resistance on the RTD at the signal frequency. At relatively low frequencies however, the value of Zline is effectively the dc resistance of the wires that makeup the line and this resistance can be made arbitrarily small. As a result of the use of resistor 106 the dc resistance presented to the RTD by the line-generator circuit can be kept small enough to satisfy the requirement for oscillation while allowing effective quenching of the oscillator over a broad range of frequencies.

Figure 15:
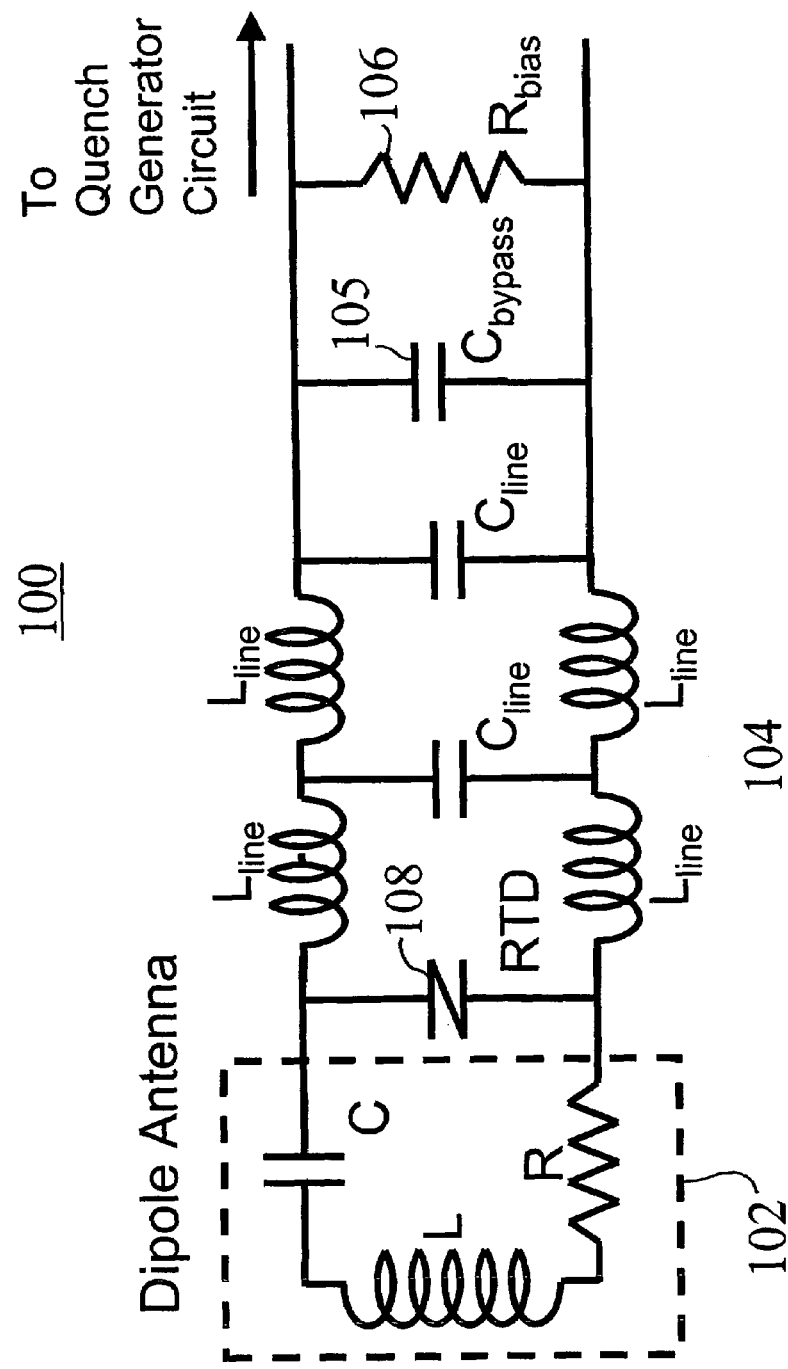
FIG. 15 shows a schematic of the quenched oscillator of FIG. 14.

If fabricated on an Indium Phosphide substrate, a detector 100 with a center frequency of 100 GHz will have the following dimensions. Dipole antenna 102 will be about 200 micrometers in length and 20 micrometers wide. The line 104 will be about 100 micrometers in length, use 10 micrometer wide lines, and have a center-to-center line spacing of about 20 micrometers. More generally, the length of line 104 can be selected so that it has an electrical length equal to any odd integral number of quarter wavelengths at the signal frequency F. Since the RTD 108 will have an inherent junction capacitance, the detector 100 will be resonant at a signal frequency somewhat less than predicted from the physical length of dipole 102. An electrical equivalent circuit of quenched oscillator 100 is shown in FIG. 15. The subcircuit consisting of capacitors Cline and inductors Lline represents transmission line 104. Preferably, the RC time constant of bypass capacitor 105 with bias resistor 106 and the quench generator source resistance should be less than the quench frequency. For example, a version of detector 100 with a center signal detection frequency of 100 GHz could use a bypass capacitance of 1 picofarad to effectively serve as a low (0.8 ohms) impedance shunt at 100 GHz. Using a 10 GHz quench rate from a 50 ohm generator, the value of bias resistor 106 can have any value whatever and still result in a RC time constant for the quench circuit of less than 100 picoseconds. For this example, resistor 106 need only be adjusted so that Equation 1 is satisfied by the overall circuit.

Figure 16:
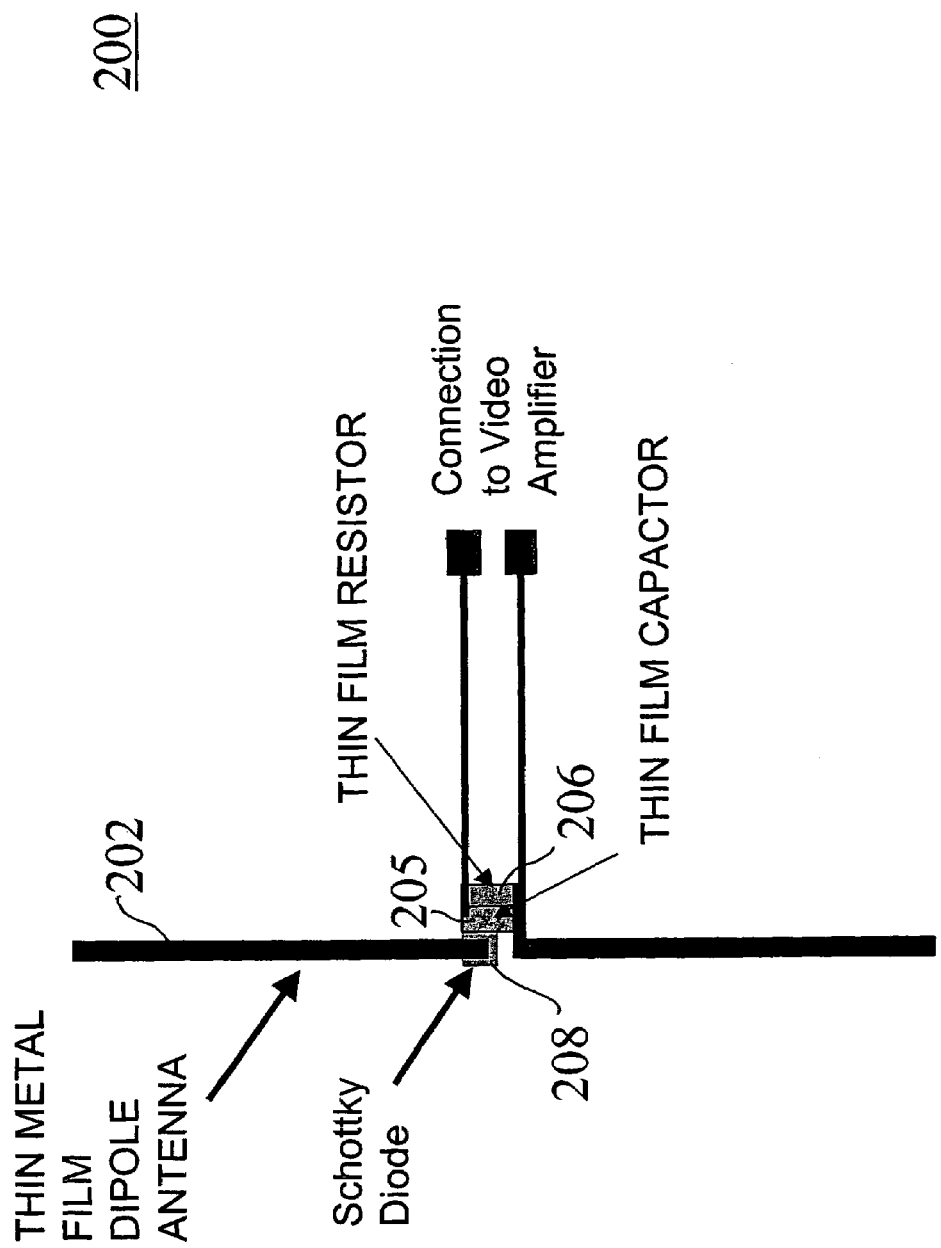
FIG. 16 shows the top view of a free-space power meter to be used to monitor the radiated power from a quenched millimeter wavelength oscillator.
Figure 17:
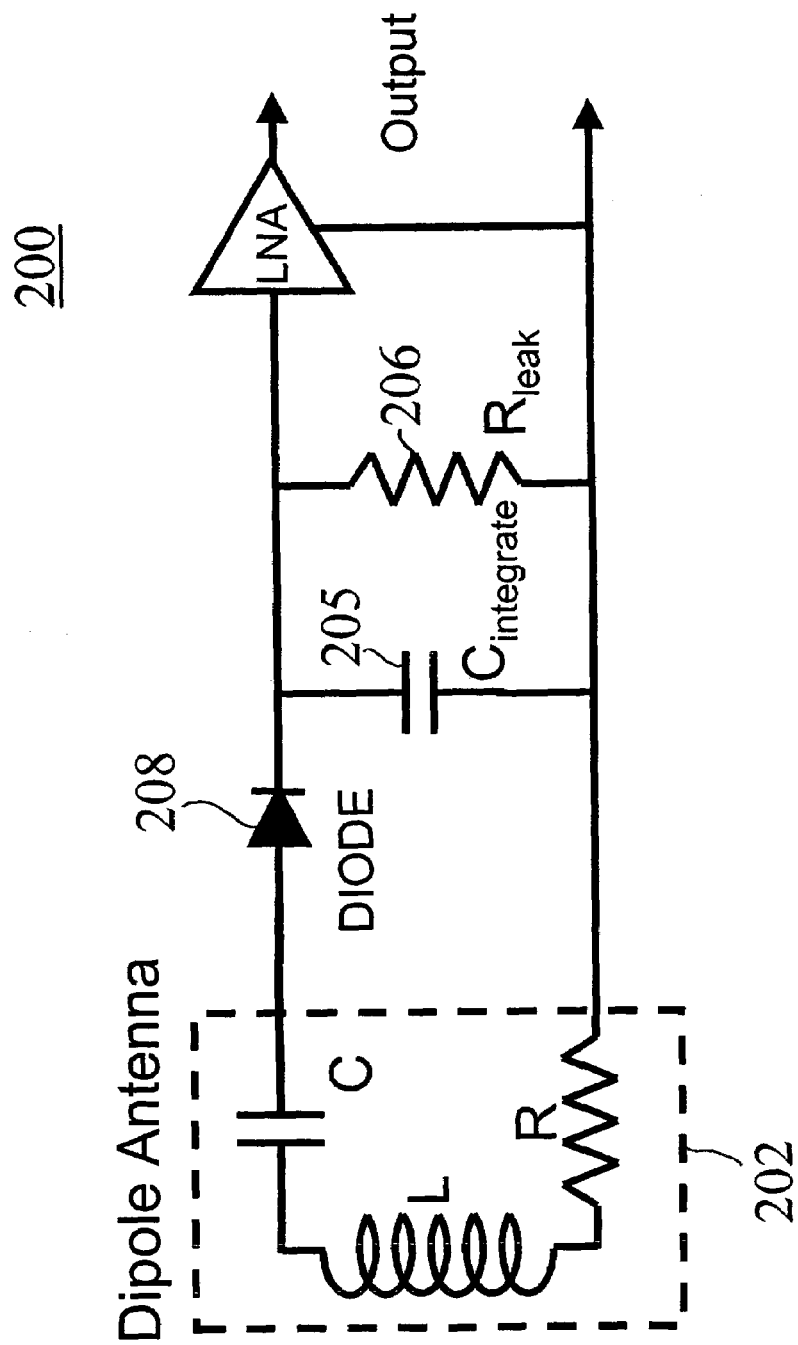
FIG. 17 shows a schematic of the millimeter wavelength power meter of FIG. 16.

Power meter 200 is placed in proximity to dipole 102 so that the oscillation power of the circuit can be measured. Since the quenched oscillator 100 consists of an oscillating RTD connected to an antenna, power meter 200 can be provided by a RF-coupled rectifying antenna placed in the proximity to dipole 102. FIG. 16 shows an example of power meter 200 consisting of a dipole antenna 202, a Schottky diode rectifier 208, thin film capacitor 205 and thin film resistor 106. RF energy radiated from quenched oscillator 100 is collected by dipole 202 that is placed in proximity to dipole 102. The RF energy received by dipole 202 is applied as an RF voltage across diode 208 and a parallel combination of capacitor 205 and resistor 206. When forward biased by the RF voltage, diode 208 acts as a resistor of low value and the capacitor is partially charged. When reversed biased by the changing RF signal polarity, diode 208 acts as an open circuit so that capacitor 205 does not discharge during this half cycle. Thus the capacitor tends to accumulate a net charge proportional to the strength of the received RF energy. Resistor 206 provides a leakage path for charge stored on the capacitor so that the average voltage across the capacitor rises and falls with the average power received by dipole 202 and rectified by diode 208. Preferably the RC time constant of the parallel combination of capacitor 205 and resistor 206 should be roughly equal to the quench period (1/quench rate) of the quenched oscillator 100 but significantly longer than the signal period (1/F). For example, if power meter 200 is used to measure 100 GHz oscillation from quenched oscillator 100, capacitor 205 might have a value of 10 picofarads and resistor 206 should then have a value of about 10 ohms. A low-noise amplifier 210 is connected across the RC network to serve as a buffer of the measured power. The output of this amplifier represents the overall output of detector 90. If the input resistance of amplifier 210 is very low then resistor 206 should be adjusted so that the overall RC time constant for the power meter 200 is roughly equal to the period of the quench rate for the detector. FIG. 17 shows the electrical equivalent circuit for power meter 200. A low noise amplifier can be integrated onto the power meter substrate or connected remotely using conventional means such as wire bonding or flip-chip bonding.

The physical dimensions of dipole 202 would be approximately the same as dipole 102. The exact length of dipole 202 should be adjusted to compensate for the tuning effects of the other circuit elements so that the maximum response of the power meter occurs at the detection frequency F of oscillator 100.

Figure 18:
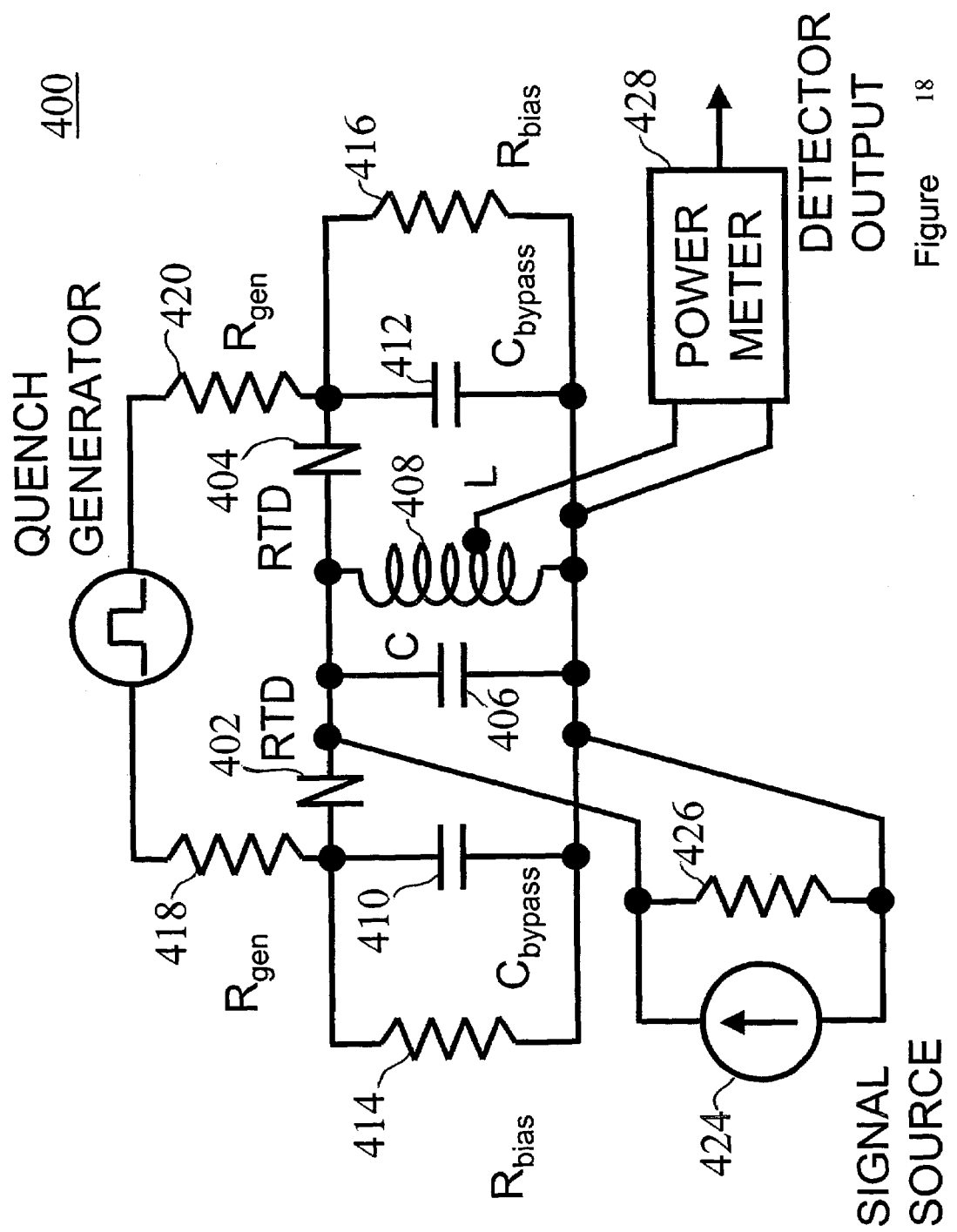
FIG. 18 shows the schematic of a conceptual millimeter wavelength super-regenerative detector using a push-pull arrangement of resonant tunneling diodes.

An alternative circuit for an RTD-based super-regenerative detector is shown in FIG. 18. Here, a pair of RTDs 402 and 404 are arranged in a push-pull oscillator configuration. The inductor 408, capacitor 406, and shunt RTD capacitance's establish the detector resonance condition. For example, a pair of 2 $\square$m RTDs 402 and 404 have a typical net junction capacitance of 0.02 picofarads. A 50 pH inductor 408 and 0.03 picofarad capacitor 406 will result in a circuit resonant frequency F of about 100 GHz. The inductor 408 is connected to the power meter 428 and the input signal source 424 and its source resistance 426 are connected across inductor 408 and capacitor 406. Power meter 428 can be implemented using the same circuit as power meter 17. The resistors 414, 416, 418, and 420 and capacitors 410 and 412, and generator 422 comprise the quench generator analogous to quench generator 16. Since inductor 408 ideally provides a zero dc resistance, resistors 414, 416, 418, and 420 are each adjusted so that Equation 1 is satisfied for each RTD separately. For example, if the same RTDs were used as in FIG. 6 then resistors 414 and 416 can each be 35 ohms and resistors 418 and 420 can each be 50 ohms. With these values, quench generator 422 would be set to provide a minimum and maximum output voltage twice that of the generator in FIG. 6. Capacitors 410 and 412 are adjusted in value to provide an effective de-coupling of RF energy within the circuit from the quench generator circuitry.

The signal source in detector 400 can be a conventional electronic signal generator or a dipole antenna as was used in quenched oscillator 100. The power meter 428 can in this case be the same as power meter 200.

Figure 19:
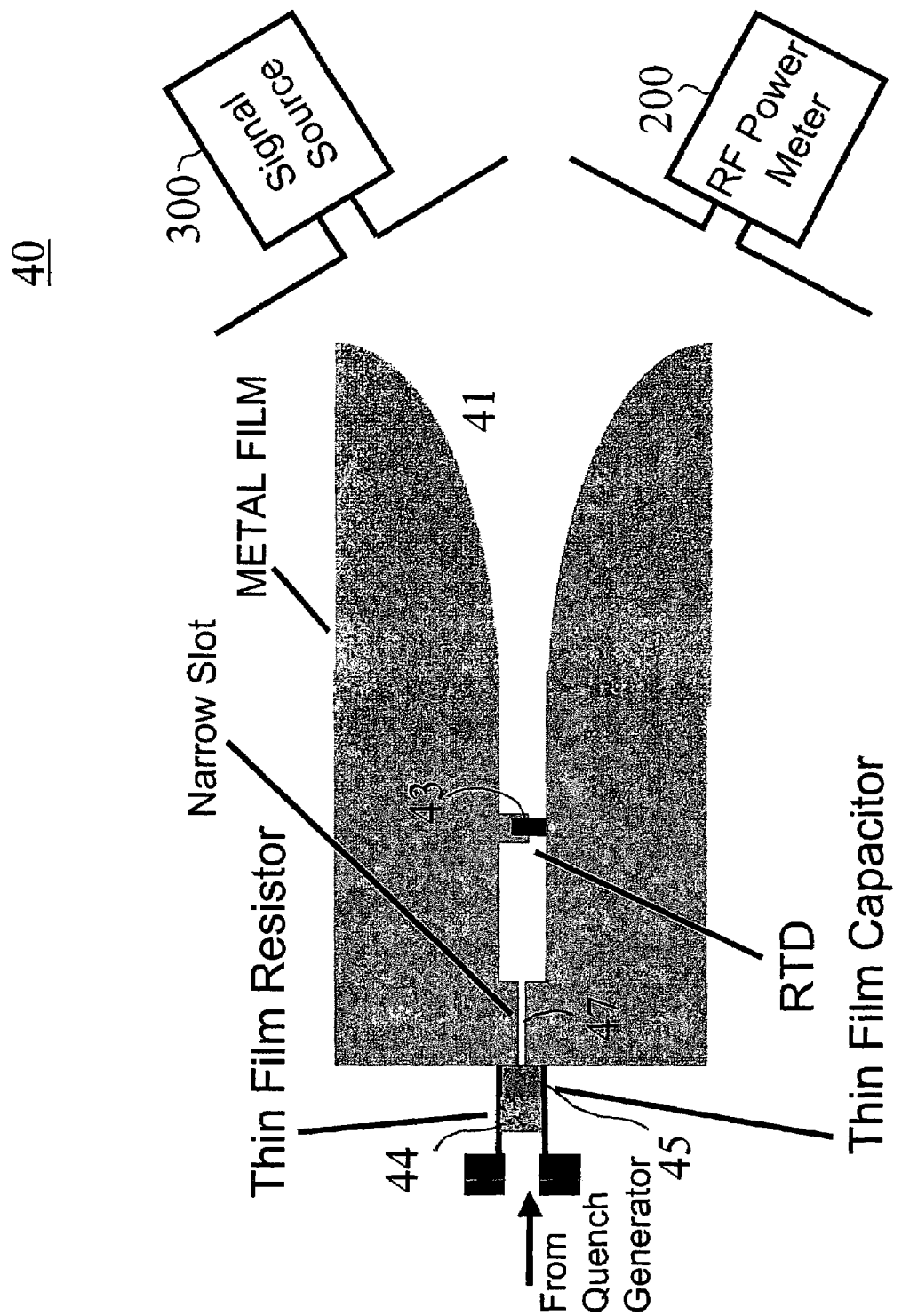
FIG. 19 is a schematic of a conceptual super-regeneration detector using a single resonant tunneling diode integrated with a tapered slot transmission line antenna.

There are many variations on the RTD oscillating detector theme that will provide a sensitive millimeter-wave detector. A single-RTD version of a millimeter-wave detector-antenna configuration is shown in FIG. 19. Here, a tapered slot transmission line antenna (TSA) 41 is used to collect millimeter-wave radiation. The antenna 41 can be of metal walls or metal film over a dielectric body. The oscillating RTD 43 is placed across the "stub-end" of the TSA 41. A narrow slot 47 is included in the TSA so that the RTD may be electrically biased. Slot 47 is made very narrow in comparison to the signal wavelength so that it acts effectively as an electrical short circuit at the frequency F. Resistor 44 and capacitor 45 are used as necessary to respectively satisfy equation 1 and to isolate, at the RF frequency F, the quench generator circuitry. The RTD 43 is located so that its RF impedance matches that of the slot-line. For example, a 2 µm2 RTD has a shunt capacitance of about 10 ff (femtofarad). This presents a capacitive reactance of 53 ohms at 300 GHz. The resistive impedance of the same RTD is about 100 ohms for a 50,000 ampere/cm2 device. The RTD 43 is placed at a point on the slot line so that the line presents 53 ohms of inductive reactance to the RTD 43. The line reactance at this point will cancel the RTD reactance and so establish a resonance condition for the detector. Power meter 200 or equivalent can be used to monitor the power in the oscillator.

What is claimed is:

1. A microwave detector comprising:
   an oscillator using resonant tunneling diode at the center frequency of interest;
   a quench circuit coupled to said oscillator for periodically biasing said oscillator into and out of oscillation; and
   an input circuit for applying an input signal to be detected and circuitry for detecting the average amount of power consumed by the oscillator, for determining the signal strength of the input signal.

2. The detector of claim 1, wherein said quench circuit is a quench generator.

3. The detector of claim 2, wherein said input circuit is coupled to an antenna.

4. The detector of claim 2, wherein said quench generator operates at a lower frequency than said oscillator.

5. The detector of claim 4, wherein said quench generator operates at a frequency less than 10 percent of the first mentioned oscillator frequency.

6. The detector of claim 5, wherein said input circuit includes a tapered slot line antenna coupled to said tunneling diode.

7. The detector of claim 2, wherein said input circuit is coupled to an antenna.

8. The detector of claim 1, wherein said oscillator includes an inductor coupled to said resonant tunneling diode and a power meter coupled to the inductor for providing the output from the detector.

9. The detector of claim 1, wherein output from said detector is measured by a free space power meter tuned to the detection frequency.

* * * * *